Jan. 26, 1960 R. N. HALL 2,922,934

BASE CONNECTION FOR N-P-N JUNCTION TRANSISTOR

Filed May 11, 1953

Inventor:
Robert N. Hall,
by Paul A. Frank
His Attorney.

United States Patent Office 2,922,934
Patented Jan. 26, 1960

2,922,934

BASE CONNECTION FOR N-P-N JUNCTION TRANSISTOR

Robert N. Hall, Schenectady, N.Y., assignor to General Electric Company, a corporation of New York Application May 11, 1953, Serial No. 354,180
11 Claims. (Cl. 317—235)

Figures 1, 2:
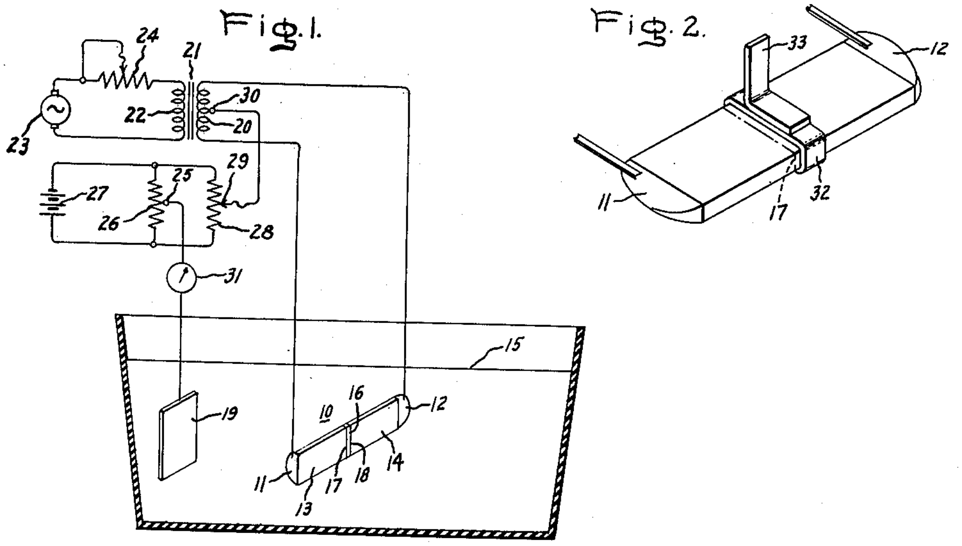

My invention relates to semiconductor devices and more particularly to devices employing a semiconductor unit having two endwise zones of N-type conductivity separated by and forming rectifying barriers called P–N junctions with an intermediate layer or zone of P-type conductivity; which units have become known as N–P–N junction semi-conductor units. In making a transistor from such N–P–N junction units, emitter and collector electrodes are respectively connected to the N-type zones and a "base" or "return" electrode is connected to the intermediate P-type zone.

For optimum high gain and high frequency performance of such N–P–N junction transistors, the P-type zone is usually constructed in the form of a very thin layer ordinarily in the neighborhood of one or two mils thickness. The exposed surface edge of the P-type layer is likewise very thin, and it is quite difficult if not impossible to solder an electrode to this thin exposed edge in the customary manner. Consequently, it has become the practice to use a pointed or sharpened electrode which is carefully placed only on the exposed edge of the P-type layer and spot welded to the P-type layer by passing sufficient current through the contact thus formed. This method, however, presents many difficulties. Firstly, it is difficult to position the sharpened electrode only upon the exposed edge of the P-type zone without overlapping a P–N junction or even missing the P-type zone altogether. Secondly, the welding process brings about a fusion of the electrode with a surface portion of the P-type zone and this fused region often overlaps the P–N junctions impairing their rectification characteristics. Moreover, the restricted area of connection to the P-type zone often results in a high resistance type connection which also impairs the over-all quality of the transistor.

Accordingly, one object of the invention is to provide an N–P–N junction transistor having a good electrically conductive connection to the P-type layer with no deleterious effect upon the characteristics of the N–P–N junction unit.

Another object is to provide a low resistance base connection to an N–P–N junction transistor which does not short circuit or reduce the rectification characteristics of the P–N junctions thereof.

A further object of the invention is to provide a method of making an electrical connection to the P-type region of an N–P–N junction semiconductor unit which eliminates the necessity of hunting for the exposed surface edge of the P-type layer and which inherently makes connection to such exposed edge and not to any other region of the N–P–N junction unit.

A still further object of the invention is to provide a new method for making a low resistance connection of any desired thickness to the exposed surface of the P-type region of an N–P–N junction semiconductor unit.

In general, in accord with the invention the base connection to the P-type layer is made by electroplating an electrically conducting metal to the entire exposed surface of the P-type layer. This electroplated connection is confined only to the P-type layer or zone by a selective electroplating process which utilizes the rectification characteristics of the P–N junctions of the N–P–N junction unit to maintain the N-type zones of the unit at a different electrical potential than the P-type zone. The P-type zone is maintained at an electrical potential negative with respect to both adjoining N-type zones and is immersed within an electroplating solution which is maintained at a potential that is positive with respect to the P-type zone but negative with respect to each N-type zone of the semiconducting unit. As a consequence, only the P-type zone acts as a cathode in the electroplating system, and a conductive metal layer is plated only to the surface of the P-type zone. This electroplated layer forms a complete conductive ring around the P-type zone and makes excellent electrically conductive contact therewith. Since no heating or alloying of the P–N junction unit is involved, there is no disturbance of the initial rectifying characteristics of the P–N junction units. Moreover, the base connection may be built-up to any desired small thickness by merely increasing the length of time that the unit is subjected to the electroplating process. If desired, the electroplated layer is built-up until a ridge of metal is formed adhering to the surface of the P-type layer, and a pressure contact or other suitable type of contact is easily made to this metal ridge.

In one specific method of making this electroplated base connection, an alternating voltage is applied between the N-type zones and a direct voltage is supplied to the electroplating solution through a suitable anode. No voltage is applied directly to the P-type zone but nevertheless this P-type zone assumes an electrical potential that is negative relative to the N-type zones as a result of the rectifying action of the P–N junctions, as will be more fully explained hereinafter. The P-type zone is then used as the cathode in the electroplating system.

In another specific method of making this electroplated base connection temporary or permanent contacts are first made to the P-type zone as well as the N-type zones. A unidirectional voltage is then applied directly between the P-type zone and each N-type zone to maintain the P-type zone at a negative potential relative to the N-type zones as a result of the current blocking action of each P–N junction. The P-type zone is then similarly used as the cathode in an electroplating system.

In accord with a further feature of the invention the surface of the semiconductor unit encompassing the electroplated region and the P–N junctions is etched by a chemical or electrolytic etching process which dissolves away a portion of the electroplated material immediately adjacent the P–N junctions and thus minimizes the possibility of short-circuiting these junctions.

Figure 3:
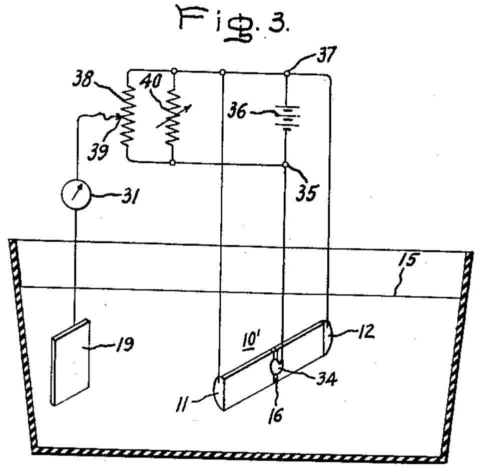
Figure 4:
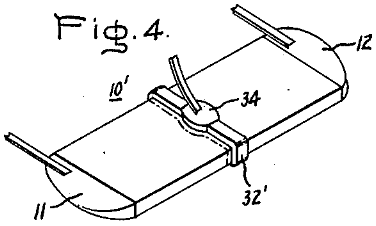

The novel features believed characteristic of the invention are set forth in the appended claims. The invention itself, however, together with further objects and advantages thereof may best be understood by referring to the following description taken in connection with the accompanying drawing in which Fig. 1 is a schematic diagram of circuit and apparatus illustrative of one method of practicing the invention, wherein the P-type layer is maintained at proper negative potential relative to the N-type zones without direct connection to the P-type zone;

Fig. 2 is a perspective view of one type of base connection to the P-type zone of a transistor made in accord with the method illustrated by Fig. 1;

Fig. 3 is a schematic diagram of a circuit and apparatus illustrating an alternative method for practicing the invention in which direct connection is made to the P-type zone in order to establish the proper potential gradients between the P-type zone and the adjoining N-type zones; and Fig. 4 shows a transistor embodying an improved base connection made in accord with the method illustrated in connection with Fig. 3.

One method of constructing an improved N–P–N junction transistor in accord with the invention is shown in connection with the apparatus and circuit diagram of Fig. 1. An N–P–N junction semiconductor unit 10 has a pair of metal electrodes 11 and 12 corresponding to "emitter" and "collector" electrodes of a transistor fused or otherwise connected to opposite endwise N-type zones 13 and 14. Unit 10 and electrodes 11 and 12 are immersed within a metal compound electroplating solution 15. N–P–N junction semiconductor unit 10 has a thin P-type zone or layer 16 separating N-type zones 13 and 14 and forming rectifying barriers known as P–N junctions 17 and 18 respectively therewith. Semiconductor unit 10 may conveniently be a small germanium bar .25 inch long, .1 inch wide, and .020 inch thick. For transistors, P-type zone 16 preferably has a thickness between N-type zones 13 and 14 of less than .002 inch. Electroplating solution 15 may consist of any of the well-known metal compound solutions from which a conductive metal may be extracted by electrolysis under the influence of an ionizing electrical current; water solutions of gold cyanide, gold fluoride, copper sulfate, and indium cyanide being convenient and suitable. The water solution of indium cyanide has been found particularly suitable since indium is an "acceptor activator element" for germanium and silicon semiconductors and thereby tends to intensify the P-type character of the surface of the P-type zone to which it is electroplated while having less short-circuiting effect upon P–N junctions 17 and 18 in the event the indium should be deposited in a manner overlapping these junctions. The electrical potential of plating solution 15 is controlled by means of an electroplating anode 19 which may conveniently be composed of graphite or stainless steel.

In accord with the invention the selective electroplating of only the exposed edge of P-type layer 16 is accomplished by establishing a potential gradient across N–P–N junction unit 10 such that P-type layer is at a negative potential relative to N-type zones 13 and 14 while solution 15 and anode 19 are maintained at an electrical potential that is positive with respect to P-type zone 16 but negative with respect to N-type zones 13 and 14. In Fig. 1 these electrical potential conditions are established in semiconductor unit 10 and in electroplating anode 19 without direct connection to P-type zone 16. Electrodes 11 and 12 in conductive relation respectively with N-type zones 13 and 14 are connected to opposite ends of a center tapped secondary winding 20 of a transformer 21 whose primary winding 22 is connected to be energized by alternating current from an alternating current source 23 through a series connected adjustable resistance 24. An alternating voltage of adjustable magnitude is thus supplied between electrodes 11 and 12 of semiconductor unit 10. This alternating voltage is preferably adjusted to a fairly small value such as, for example, between 0.5 and one volt. Electroplating anode 19 is maintained at a proper potential relative to unit 10 by connection through a current measuring instrument 31 to the tap 25 of a voltage dividing resistor 26 connected in parallel with a battery 27 and a potentiometer 28 whose adjustable tap 29 is connected to the center tap 30 of transformer 21. Tapped resistors 26 and 28 constitute a D.-C. bridge enabling adjustment of the relative electrical potentials applied to semiconducting unit 10 and electroplating anode 19. The voltage supplied to electrodes 11 and 12 constitutes the alternating voltage derived from source 23 through transformer 21 superimposed upon the unidirectional voltage supplied from battery 27 through resistor 28. The voltage on electroplating anode 19 constitutes only the unidirectional voltage derived from battery 27 through tapped resistor 26. The average electrical potential of the P-type zone 16, however, is more negative than the unidirectional voltage subsisting at the tap 29 of resistor 28 which of course corresponds to the center tap 30 of transformer 21. This is due to the unique properties of the N–P–N junction semiconductor unit whereby P–N junctions 17 and 18 each serve to rectify the alternating current applied between electrodes 11 and 12 during opposite polarity alternations of source 23. During one polarity alternation of source 23, electrode 11 has a positive potential relative to electrode 12, and positive current tends to flow in the easy or forward direction through P–N junction 18 from P-type zone 16 to N-type zone 14. Little or no voltage drop is developed across P–N junction 18 so that zone 16 assumes the electrical potential of electrode 12. Since electrode 11 and N-type zone 13 are at a positive potential relative to P-type zone 16, the other P–N junction 17 acts to block current during this alternation and the entire alternating voltage drop is developed across this latter P–N junction 17. During opposite polarity alternations of source 23, electrode 12 is positive with respect to electrode 11 and current flows in the easy flow direction across P–N junction 17 but in the difficult flow direction across P–N junction 18 such that P-type zone 16 again remains negative with respect to the positive electrode 12. It will thus be seen that electrodes 11 and 12 as well as N-type zones 13 and 14 to which they are connected have an average unidirectional component of alternating voltage supplied thereto which is positive with respect to the average potential of P-type zone 16. By varying the position of tap 29 of resistor 28, the electrical potential of electroplating anode 19 may be easily adjusted relative to the electrical potentials subsisting in P–N junction unit 10. Anode 19 is thus made slightly positive relative to the P-type zone 16 but slightly negative or at substantially the same electric potential as N-type zones 13 and 14. It will be appreciated that anode 19 need only have a slightly more positive voltage than P-type zone 16, for example, an excess of less than .5 volts since ionization and electroplating of the metal within plating solution 15 upon P-type zone 16 is best accomplished with small currents of the order of 20 microamperes.

The amount of metal deposited by this electroplating process depends, of course, upon the length of time it is allowed to continue. Under proper conditions a film or ridge 32 of metal about .0005 inch thick is formed within 15 minutes covering the surface of P-type zone 16. This metal layer or film 32 (best seen in Figs. 2 and 4) forms an excellent low resistance connection to P-type zone 16.

Metal film or layer 32 is initially deposited over the entire exposed surface of P-type zone 16 and is thus contiguous with and may even slightly overlay P–N junctions 17 and 18. In order to prevent short-circuiting of these junctions by the contiguous or overlapping endwise edges of metal layer 32, the entire surface region of N–P–N junction unit 10 encompassing the P-type zone 16 and the P–N junctions 17 and 18 is preferably etched by a chemical or electrolytic etching process. Various well known chemical etchants may be used; for example, a mixture of 20% hydrofluoric acid and 80% nitric acid. A small surface portion of the deposited metal layer 32 is eaten away by this etching process especially at the sides thereof where the deposited layer 32 originally meets the P–N junctions 17 and 18, thereby exposing and cleaning the edges of P–N junctions 17 and 18 and removing any portions of layer 32 which might overlap and short-circuit these junctions. The resulting configuration of electroplated layer 32 after this etching process is best seen in Fig. 2. A resilient metal clip 33 is then placed in contact with the central projecting ridge of layer 32 under suitable pressure to make good electrical connection therewith. Alternatively, a metal wire or other electrical conductor may be fused or soldered with electroplated metal layer 32.

An alternative way of constructing an electroplated base connection to P-type layer 16 is shown in connection with Fig. 3. In accord with the method of Fig. 3 a temporary or permanent electrical connection is first made in any suitable manner to the P-type zone. Preferably, an electrode 34 consisting of an acceptor activator element, such as indium, is fused to a surface-adjacent portion of the P-type zone 16 of a germanium or silicon N–P–N junction unit 10'.

Alternatively, a metal electrode making point or line contact with a portion of P-type zone 16 may be employed. Activator electrode 34 is connected to the negative terminal 35 of battery 36 while electrodes 11 and 12 are connected to the positive terminal 37 of battery 36. A rheostat 40 and a potentiometer 38 are connected in parallel across battery 36, and the tap 39 of potentiometer 38 is connected through current measuring instrument 31 to electroplating anode 19. Semiconductor N–P–N junction unit 10' is then immersed within metal plating solution 15, and tap 39 of potentiometer 38 is adjusted to provide a proper electroplating current as measured by instrument 31. Since P-type zone 16 is at a negative potential with respect to electroplating anode 19 which in turn is at a negative potential relative to electrodes 11 and 12, P-type zone 16 acts as the cathode of the electroplating system and receives the deposited metal layer 32. It will be appreciated that electrode 34 must make electrical connection only with P-type zone 16 and cannot function to short circuit P–N junctions 17 or 18. Otherwise, there would be little difference in electrical potential between N-type zones 12 and 13 and P-type zones 16. However, if an acceptor activator element such as indium is used for electrode 34 and is fused to an N–P–N junction body comprising germanium or silicon, this acceptor activator need not be fused in contact only with P-type layer 16 but may overlap P–N junctions 17 and 18. This is because the fusion of this acceptor activator with the semiconductor produces a rectifying P–N junction barrier between the semiconductor material impregnated by such fusion with the acceptor activator and the remainder N-type semiconductor material in zones 13 and 14. The rectifying P–N junctions thus formed merge with the previous P–N junctions 17 and 18 such that the acceptor activator electrode 34 makes good electrical contact only with the P-type zone 16 and makes rectifying contact with the remainder N-type zones 13 and 14. When an N–P–N junction semiconductor unit having such fused acceptor activator electrode 34 is subjected to the electroplating process described above in connection with Fig. 3, an electroplated layer 32' is deposed upon the remainder exposed edge of P-type zone 16 and merges with this fused acceptor electrode 34, thereby to extend the area and improve the base connection to P-type layer 16. The entire base connection region including the acceptor activator 34 and the electroplated layer 32' is then preferably etched to remove any possibility of short-circuiting the P–N junctions 17 and 18 at their exposed edges. The resulting transistor is illustrated in Fig. 4.

Although a chemical etching process may be employed, the method of practicing the invention described in connection with Fig. 3 may be more advantageously used with an electrolytic etching process since the same electrolysis equipment may be used both for electroplating metal layer 32' as well as for electrolytical etching of this electroplated layer. In carrying out this electrolytic etching process the metal plating solution 15 is merely replaced with an electrolytic etching solution, such as a solution of 20% sodium hydroxide in water, and rheostat 40 is adjusted to give a proper etching current, for example, .1 ampere. This electrolytic method for removing the rectifying barrier short-circuit of P–N junction units forms a portion of the subject matter described and claimed in a copending application, Serial No. 268,272 filed by R. J. Herbert on January 29, 1952, and assigned to the same assignee as the present invention.

The acceptor activators for garminium and silicon semiconductors are well-known and, in general, comprise elements lying in group III of the periodic table of elements, such as indium, gallium and aluminum. The method of making a P–N junction-overlapping acceptor activator connection to a P-type zone of an N–P–N junction unit as well as the improved N–P–N junction unit resulting therefrom forms a portion of the subject matter covered by my copending application Serial No. 321,262, filed November 18, 1952, and assigned to the same assignee as the present invention. The embodiment of the present invention shown in connection with Figs. 3 and 4 constitutes an improvement in the method and resulting device over the method and device disclosed in this latter patent application.

It will thus be seen that I have provided a method of making good electrically conductive connection to substantially the entire exposed surface of a thin P-type zone of an N–P–N junction semiconductor unit. In accord with one way of making this connection the surface of the P-type zone is electroplated without the necessity of an electrical contact to the zone. In accord with another way of making this connection an electrode is first connected to a small portion of this P-type zone and the remainder portion is then similarly electroplated. If an acceptor activator is used for the material deposited on the P-type layer by this electroplating method, there is little danger of short-circuiting the P–N junctions on either side of the layer and no reduction in the rectification characteristics of these P–N junctions. If metals other than acceptor activators are used and even if acceptor impurity elements are used, the region of the N–P–N junction unit encompassing this base connection is preferably etched to remove the possibility of short-circuiting the P–N junctions. The resulting electroplated base connection is securely bonded in good conductive contact with the entire P-type layer and makes a low resistance connection therewith and yet provides a projecting ridge to which an electrode may be pressed or fused.

Although I have described above particular ways of practicing my invention and particular devices constructed in accordance with my invention, many modifications can of course be made; and it is to be understood that I intend by the appended claims to cover all such modifications as fall within the true spirit and scope of the invention.

What I claim as new and desire to secure by Letters Patent of the United States is:

1. A transistor comprising a semiconductor bar having two endwise N-type zones and an intermediate thin P-type zone less than 0.002 inch thick forming P–N junctions with said N-type zones, separate electrodes connected to said N-type zones, and a further electrode comprising a metal layer selectively electroplated only to the surface of said P-type zone, the surface of said semiconductor bar and electroplated metal layer being etched in the regions adjoining and overlapping said P–N junctions.

2. A transistor comprising a semiconductor bar having two endwise N-type zones and an intermediate thin P-type zone forming P–N junctions with said N-type zone, separate electrodes connected to said N-type zones, a further electrode comprising an acceptor activator fused to and with a portion of the surface of said P-type zone, and a metal layer electroplated to the remainder surface portion of said P-type zone, said electroplated layer contacting said acceptor activator electrode.

3. A transistor of claim 2 wherein the acceptor activator electrode comprises indium.

4. The method of making an electrical connection to a thin P-type zone of a semiconductor unit having two N-type zones adjoining opposite sides of said P-type zone and forming rectifying P–N junctions therewith, which method comprises immersing said unit and an electroplating anode in a metal compound electroplating solution, maintaining said anode at a first electrical potential, maintaining said N-type zones at a second electrical potential positive with respect to said anode potential, maintaining said P-type zone at an electrical potential negative with respect to said anode potential, thereby causing a layer of metal from said solution to be electroplated upon the exposed surface of said P-type region.

5. The method of claim 4 including the step of etching the surface of the semiconductor unit and electroplated metal layer in the regions adjoining and overlapping the P–N junctions.

6. The method of making an electrical connection to a thin P-type zone of a semiconductor unit having two N-type zones adjoining opposite sides of said P-type zone and forming rectifying P–N junctions therewith, which method comprises immersing said unit and an electroplating anode in a metal compound electroplating solution, connecting each N-type zone to a different terminal of an alternating voltage source whereby said P-type zone is maintained at an electric potential negative with respect to said N-type zones by the rectifying action of said P–N junctions, and supplying a unidirectional electric potential positive with respect to said P-type zone but not positive with respect to said N-type zones to said anode thereby to electroplate the metal from said soluion only upon said P-type zone.

7. The method of claim 6 including the step of etching the surface of the semiconductor unit and electroplated metal in the regions adjoining and overlapping the P–N junctions.

8. The method of making an electrical connection to a thin P-type zone of a semiconductor unit having two N-type zones adjoining opposite sides of said P-type zone and forming rectifying P–N junctions therewith, which method comprises immersing said unit and an electroplating anode in a metal compound electroplating solution, connecting the N-type zones of said unit across an alternating voltage source thereby to maintain said P-type zone at an electric potential negative with respect to said N-type zones by virtue of the rectifying action of said P–N junctions, and supplying a unidirectional voltage to said anode to maintain said anode at an electric potential positive with respect to said P-type zone but negative with respect to said N-type zones to electroplate metal from said solution only upon the surface of said P-type zone.

9. The method of making an electrical connection to a thin P-type zone of a semiconductor unit having two N-type zones adjoining opposite sides of said P-type zone and forming rectifying P–N junctions therewith, which method comprises maintaining a metallic electrode in low resistance contact with the surface of the P-type zone, immersing said unit and said electrode and an electroplating anode in a metal compound electroplating solution, supplying a unidirectional potential to said anode, supplying a unidirectional potential positive with respect to said anode potential to said N-type zones, supplying a unidirectional potential negative with respect to said anode potential to said P-type zone by means of said electrode, thereby causing a layer of metal from said solution to be electroplated upon the exposed surface of said P-type region and upon said electrode.

10. The method of claim 9 wherein the semiconductor unit comprises germanium, the electrode comprises indium and the electroplating solution comprises a water solution of indium cyanide.

11. The method of claim 9 including the step of electrolytically etching the surface of the semiconductor unit, electrode, and electrodeposited metal layer in the region adjoining and overlapping the P–N junctions.

References Cited in the file of this patent

UNITED STATES PATENTS

| | | |
|---|---|---|
| 2,044,431 | Harrison | June 16, 1936 |
| 2,428,464 | Lum et al. | Oct. 7, 1947 |
| 2,443,542 | Ohl | June 15, 1948 |
| 2,623,102 | Shockley | Dec. 23, 1952 |
| 2,644,852 | Dunlap | July 7, 1953 |
| 2,654,059 | Shockley | Sept. 29, 1953 |
| 2,655,625 | Burton | Oct. 13, 1953 |
| 2,656,496 | Sparks | Oct. 20, 1953 |
| 2,663,806 | Darlington | Dec. 22, 1953 |
| 2,680,220 | Starr et al. | June 1, 1954 |
| 2,681,993 | Shockley | June 22, 1954 |
| 2,728,034 | Kurshan | Dec. 20, 1955 |
| 2,744,970 | Shockley | May 8, 1956 |
| 2,748,325 | Jenny | May 29, 1956 |
| 2,754,455 | Pankove | July 10, 1956 |

FOREIGN PATENTS

| | | |
|---|---|---|
| 436,821 | Germany | Nov. 9, 1926 |